US008188501B2

(12) United States Patent
Chen

(10) Patent No.: US 8,188,501 B2
(45) Date of Patent: May 29, 2012

(54) OPTICAL DEVICE TO EMIT POLARIZED LIGHT

(76) Inventor: Li-Lin Chen, Taipei County (TW)

( * ) Notice: Subject to any disclaimer, the term of this patent is extended or adjusted under 35 U.S.C. 154(b) by 186 days.

(21) Appl. No.: 12/838,925

(22) Filed: Jul. 19, 2010

(65) Prior Publication Data

US 2012/0012813 A1     Jan. 19, 2012

(51) Int. Cl.
*H01L 33/00*     (2010.01)
(52) U.S. Cl. ........ 257/98; 257/13; 257/14; 257/E33.069; 438/29
(58) Field of Classification Search ............ 257/13, 257/14, 98, E33.069; 438/29
See application file for complete search history.

(56) References Cited

U.S. PATENT DOCUMENTS

| | | | | |
|---|---|---|---|---|
| 5,543,638 | A * | 8/1996 | Nettelbladt et al. ............ | 257/98 |
| 6,046,465 | A * | 4/2000 | Wang et al. ..................... | 257/98 |
| 6,515,308 | B1 * | 2/2003 | Kneissl et al. .................. | 257/86 |
| 6,643,054 | B1 * | 11/2003 | Weidlich ........................ | 359/298 |
| 7,440,157 | B2 * | 10/2008 | Woodall et al. ................ | 359/245 |
| 7,622,746 | B1 * | 11/2009 | Lester et al. .................... | 257/98 |
| 7,737,455 | B2 * | 6/2010 | Shum .............................. | 257/98 |
| 8,017,963 | B2 * | 9/2011 | Donofrio et al. ................ | 257/98 |
| 2004/0141108 | A1 * | 7/2004 | Tanaka et al. ................... | 349/96 |
| 2010/0140637 | A1 * | 6/2010 | Donofrio et al. ................ | 257/98 |

* cited by examiner

*Primary Examiner* — Jarrett J Stark
*Assistant Examiner* — Nicholas Tobergte
(74) *Attorney, Agent, or Firm* — Muncy, Geissler, Olds & Lowe, PLLC

(57) ABSTRACT

An optical device capable of emitting polarized light includes a light emitting means, two multi-layer optical films disposed above and below the light emitting means and two metal layers. The two metal layers cover the two multi-layer optical layers from the upper and lower sides respectively. Each of the two multi-layer optical films includes at least two films made from materials of different refractive indexes that are stacked in a staggered manner. The optical film formed by the multi-layer optical films and metal layers provides greater reflectance to S-polarized light (TE) and higher absorption to P-polarized light. Light generated by the light emitting means emits diagonally to the optical films and is reflected several times thereof to form S-polarized light (TE) to emit sideward.

11 Claims, 5 Drawing Sheets

OPTICAL DEVICE TO EMIT POLARIZED LIGHT

FIELD OF THE INVENTION

The present invention relates to an optical device and particularly to an optical device capable of emitting polarized light.

BACKGROUND OF THE INVENTION

The conventional technique to generate polarized light generally directs a non-polarized light through a polarizer (or called polarization lens) which allows the light to pass through only in a single polarized direction and filter out light in other directions. The polarized light thus formed can be used as the light source of LCD panels or on various types of photoelectric elements.

While the aforesaid conventional technique can generate the polarized light, when in use on the LED panels or other photoelectric elements an extra polarizer has to be added. As a result, total thickness increases that makes diminishing the size and thickness of elements more difficult. Moreover, the polarizer usually is made from plastics and easily degraded and damaged by scraping. The optical lens formed with the polarizer also is more expensive. Light passing through the polarizer also generates a slight phase difference that creates troubles in optical design.

The conventional technique for making chips of blue and green LEDs (light emitting diodes) mainly adopts a MOCVD (Metal Organic Chemical Vapor Deposition) method on a sapphire substrate to grow LEDs containing multi quantum wells of GaN or AlInGaN to form an Epitaxial wafer, then is processed to become LED chips.

Shuji Nakamura et al. in Japan have reported that the polarization can occur in lattice plane of m-plane or A-plane in GaN or AlInGaN. The polarization ratio can be represented as follow:

$$\rho = |I_{perpendicular} - I_{parallel}| / |I_{perpendicular} + I_{parallel}|$$

where I is light intensity, $I_{perpendicular}$ is light intensity in vertical polarization direction, and $I_{parallel}$ is light intensity in horizontal polarization direction.

However, it does not have much practical value since the polarization ratio ρ is very small (about 0.17). Hence, the present invention aims to provide a technique to improve the polarization ratio and a practical element manufacture process.

SUMMARY OF THE INVENTION

Therefore the primary object of the present invention is to provide a device capable of generating polarized light without a polarizer.

To achieve the foregoing object the invention includes a light emitting means, two multi-layer optical films disposed above and below the light emitting means respectively and two metal layers. The light emitting means generates light. Each of the multi-layer optical films contains at least two thin films of different refraction indexes stacked in a staggered manner. The two metal layers cover the two multi-layer optical films from an upper side and a lower side.

By means of the structure set forth above, the multi-layer optical films and metal layers are combined to have a high reflectance to S-polarized light (TE) and a greater absorption to P-polarized light (TM). When the light emitting means generate a non-polarized light to emit diagonally into the optical film and be reflected, the intensity of P-polarized light is reduced significantly. Through several reflections, S-polarized light can be obtained and emit sideward.

The foregoing, as well as additional objects, features and advantages of the present invention will be more readily apparent from the following detailed description, which proceeds with reference to the accompanying embodiment and drawings. The embodiment serves merely for illustrative purpose and is not the limitation of the present invention.

DETAILED DESCRIPTION OF THE PREFERRED EMBODIMENT

Figure 1:
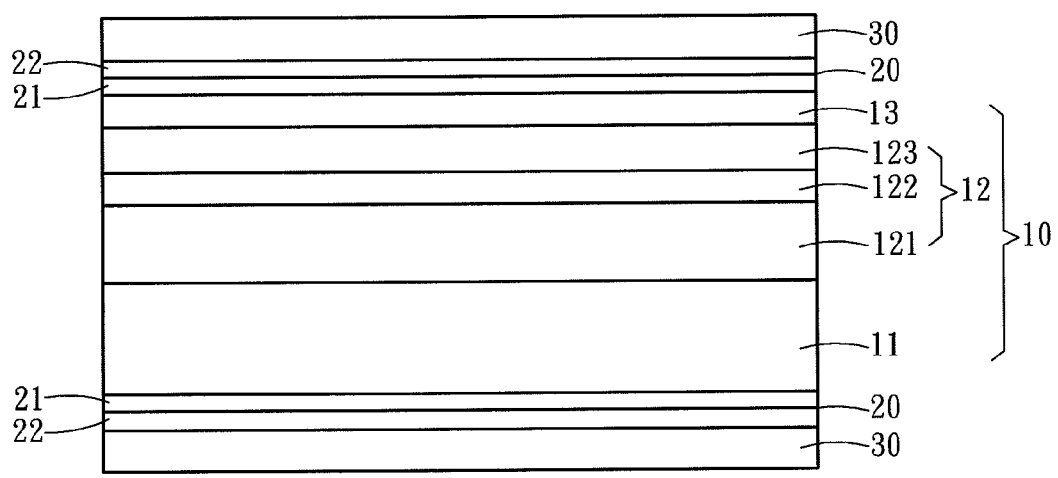
FIG. 1 is a diagram schematically showing a cross section of the present invention.

Please referring to FIG. 1, the optical device according to the present invention includes a light emitting means 10, two multi-layer optical films 20 disposed above and below the light emitting means 10 respectively and two metal layers 30. The light emitting means 10 generates light 40. The two multi-layer optical films 20 respectively include at least two thin films 21, 22 of different refraction indexes stacked in a staggered manner. The two metal layers 30 cover the two optical films 20 from the upper and lower sides.

The two thin films 21, 22 having different refractive indexes can be made from a material having a high refractive index ($n_H$) and a material having a low refractive index ($n_L$) based on a refractive index of the substrate ($n_S$) of the light emitting means 10, such that the refractive index of the light emitting means 10 is less than the high refractive index but greater than the low refractive index, namely $n_H > n_S > n_L$. The refractive index of the light emitting means 10 can be selected as $n_S = 1.7$. Hence the multi-layer optical films 20 are formed by stacking the thin films 21, 22 in a staggered manner that have refractive indexes greater than 1.7 and lower than 1.7 respectively.

The light emitting means 10 can be light emitting diodes (LEDs), but this is not the limitation. It can be other light emitting elements (referring to FIG. 2) capable of emitting the light 40, such as a cold cathode fluorescent lamp (CCFL) and the like. Take the LED as an example, the light emitting means 10 may include a sapphire substrate 11, a light emission layer 12 stacked on the sapphire substrate 11 and a transparent conductive layer 13 stacked on the light emission layer 12. The light emission layer 12 includes an N-semiconductor layer 121, an active layer 122 and a P-semiconductor layer 123 stacked together. The N-semiconductor layer 121 and P-semiconductor layer 123 can be selected from the group consisting of GaN, InGaN, AlInGaN, GaP, AlInGaP, AlInP and AlGaAs. The active layer 122 contains a multiple quantum well structure incorporating with a barrier layer. The multiple quantum well structure may be selected from the group consisting of GaN, InGaN, AlInGaN, GaP, AlInGaP, AlInP and AlGaAs. The transparent conductive layer 13 is an ITO film.

The multi-layer optical films 20 can be formed by stacking titanium dioxide and silicon dioxide in a staggered manner. The metal layer 30 can be selected from the group consisting of gold (Au), silver (Ag), aluminum (Al) and titanium (Ti).

Figure 2:
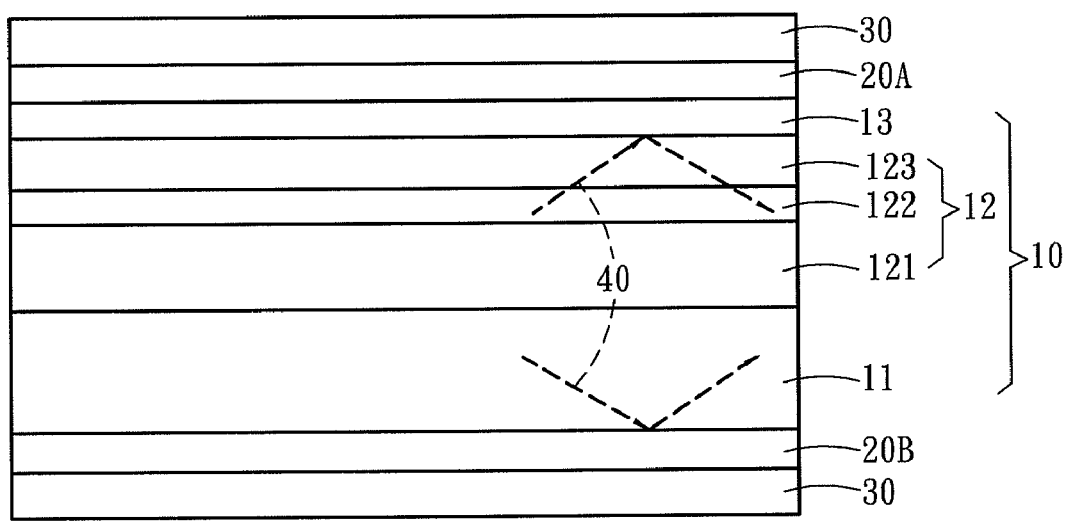
FIG. 2 is a diagram schematically showing light reflection of the present invention.
Figure 3:
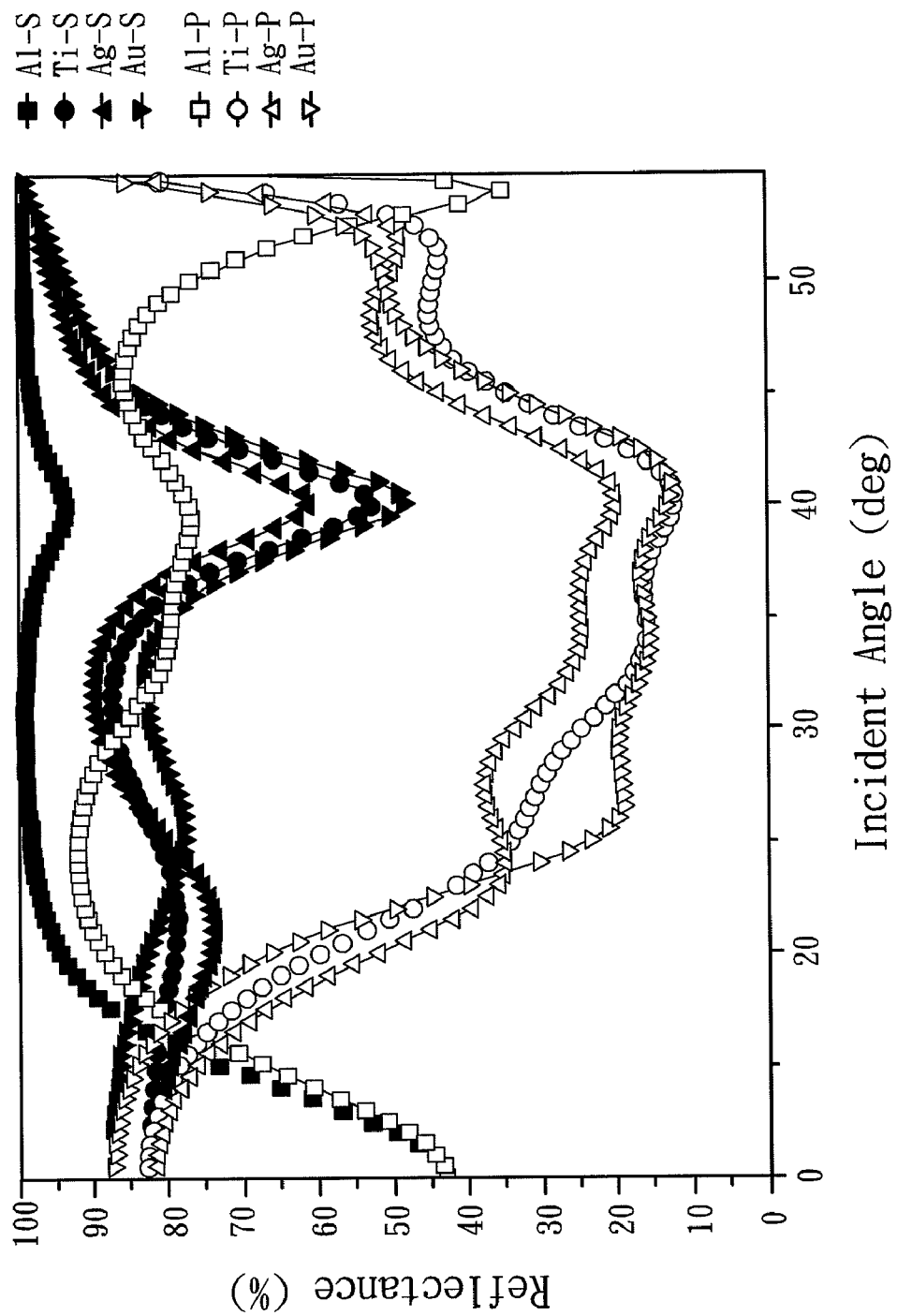
FIG. 3 is a chart illustrating reflectance of the light emitted to the multi-layer optical film disposed below the light emitting means according to the present invention.
Figure 4:
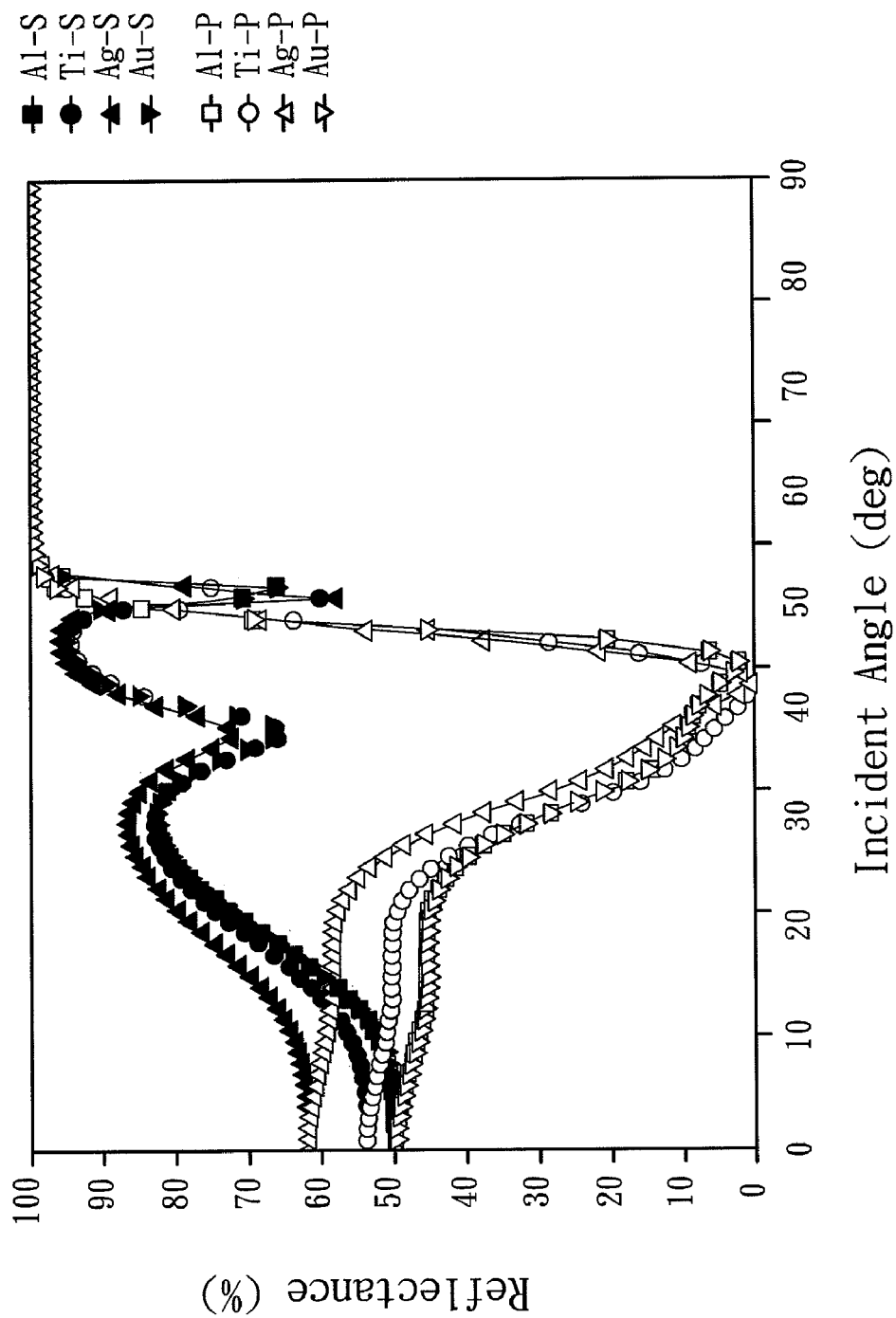
FIG. 4 is a chart illustrating reflectance of the light emitted to the multi-layer optical film disposed above the light emitting means according to the present invention.

Refer to FIGS. 2, 3 and 4 for an embodiment of the present invention. The multi-layer optical films 20A and 20B disposed above and below the light emitting means 10 respectively are made from a material of a high refractive index greater than 1.7 (such as $TiO_2$ or $Zr_2O_3$), and a material of a low refractive index less than 1.7 (such as $SiO_2$ or $MgF_2$) that are stacked in a staggered manner. In this embodiment $TiO_2$ and $SiO_2$ are being selected for stacking in a staggered manner. The thickness of $TiO_2$ and $SiO_2$ used to form the optical film 20B at various layers is indicated in the table below:

| Layer-1 | Layer-2 | Layer-3 | Layer-4 | Layer-5 | Layer-6 |
|---|---|---|---|---|---|
| $TiO_2$ 41.46 nm | $SiO_2$ 34.47 nm | $TiO_2$ 71.09 nm | $SiO_2$ 55.91 nm | $TiO_2$ 63.72 nm | $SiO_2$ 61.85 nm |
| Layer-7 | Layer-8 | Layer-9 | Layer-10 | Layer-11 | Layer-12 |
| $TiO_2$ 47.45 nm | $SiO_2$ 9.23 nm | $TiO_2$ 3.55 nm | $SiO_2$ 43.36 nm | $TiO_2$ 51.35 nm | $SiO_2$ 29.42 nm |

The thickness of the multi-layer optical film 20A, metal layer 30 (silver) and transparent conductive layer 13 (ITO) is indicated in another table below:

| Layer-1 | Layer-2 | Layer-3 | Layer-4 |
|---|---|---|---|
| Silver 120 nm | $SiO_2$ 46.54 nm | $TiO_2$ 49.53 nm | ITO 260 nm |

The metal layer 30 can be selected from the group consisting of gold (Au), silver (Ag), aluminum (Al), chromium (Cr), copper (Cu), iron (Fe), palladium (Pd), tin (Sn), indium (In), lead (Pb), titanium (Ti) and alloys thereof. In this embodiment the two metal layers 30 are selected from gold (Au), silver (Ag), aluminum (Al) and titanium (Ti) as examples for discussion. The light emitting means 10 is a LED made from InGaN/GaN, and consists of a sapphire substrate 11, a light emission layer 12 and a transparent conductive layer 13. The transparent conductive layer 13 is an ITO film stacked together.

Based on the structure set forth above, the light 40 generated by the light emitting means 10 includes P-polarized light (TM) and S-polarized light (TE) according to polarized directions. The reflectance of the light 40 emitted to the multi-layer optical films 20 disposed below and above the light emitting means 10 at different incident angles are shown in FIGS. 3 and 4. FIG. 3 shows the reflectance simulation in the sapphire substrate corresponding to varying incident angles of the light 40 for the multi-layer optical film 20 disposed below the light emitting means 10. FIG. 4 illustrates the reflectance simulation in GaN corresponding to varying incident angles of the light 40 for the multi-layer optical film 20 disposed above the light emitting means 10.

According to the results shown in FIGS. 3 and 4, with the metal layer 30 made of Au, Ag, Al and Ti, the reflectance of P-polarized light (TM) and S-polarized light (TE) that emitted diagonally changes significantly depending on varying incident angles. Overall speaking, S-polarized light (TE) has greater reflectance, while P-polarized light (TM) has higher absorption.

Figure 5:
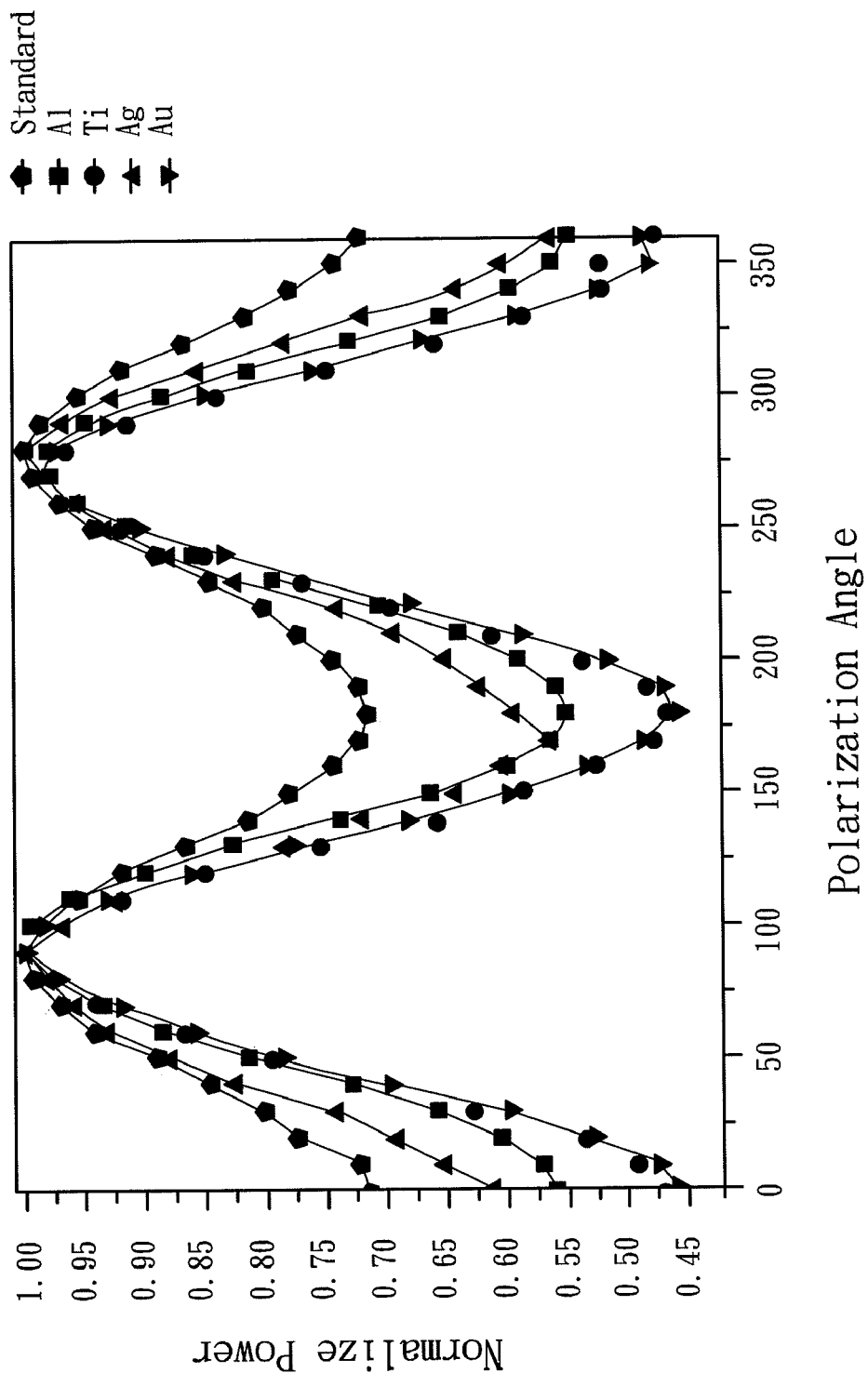
FIG. 5 is a chart illustrating normalized light intensity at different polarized angles according to the present invention.

Refer to FIG. 5 for comparisons of normalized light intensity between a polarized light generated from the optical device when the metal layer 30 is made of Au, Ag, Al or Ti, and a standard light which is emitted from the light emitting means 10 directly without the multi-layer optical film 20 and metal layer 30. The measurements are performed based on different samples. After multiple reflections the light 40 emitted diagonally forms a greater amount of S-polarized light (TE).

As a conclusion, the optical film of the present invention, formed by the multi-layer optical films 20 and metal layers 30, provides a greater reflectance for S-polarized light (TE), and higher absorption for P-polarized light (TM), as a result, the light 40 generated by the light emitting means 10 can enter diagonally and be reflected several times by the optical film to form S-polarized light (TE) and emit sideward, thus can generate polarized light without using a polarizer.

What is claimed is:

1. An optical device to generate polarized light, comprising:
    a light emitting means to generate light;
    two multi-layer optical films disposed above and below the light emitting means respectively, wherein the multi-layer optical films include respectively at least two thin films made from materials of different refractive indexes that are stacked in a staggered manner; and
    two metal layers covering the multi-layer optical films from an upper side and a lower side.

2. The optical device according to claim 1, wherein the light emitting means is a light emitting diode.

3. The optical device according to claim 2, wherein the light emitting means includes a sapphire substrate, a light emission layer stacked on the sapphire substrate and a transparent conductive layer stacked on the light emission layer.

4. The optical device according to claim 3, wherein the light emission layer includes an N-semiconductor layer, an active layer and a P-semiconductor layer stacked together.

5. The optical device according to claim 4, wherein the N-semiconductor layer and the P-semiconductor layer are made from the group consisting of GaN, InGaN, AlInGaN, GaP, AlInGaP, AlInP and AlGaAs.

6. The optical device according to claim 4, wherein the active layer includes a multiple quantum well structure incorporating with a barrier layer, and the multiple quantum well structure is selected from the group consisting of GaN, InGaN, AlInGaN, GaP, AlInGaP, AlInP and AlGaAs.

7. The optical device according to claim 3, wherein the transparent conductive layer is an ITO film.

8. The optical device according to claim 1, wherein the thin films are made respectively from a material having a high refractive index $n_H$ and a material having a low refractive index $n_L$, and the light emitting means contains a refractive index $n_S$, and the refractive index $n_S$ is lower than the high refractive index $n_H$ but higher than the low refractive index $n_L$.

9. The optical device according to claim 8, wherein the multi-layer optical films are made respectively from a material having a high refractive index greater than 1.7 and a material having a low refractive index less than 1.7 that are stacked in a staggered manner.

10. The optical device according to claim 9, wherein the material having the high refractive index is $TiO_2$ or $Zr_2O_3$, and the material having the low refractive index is $SiO_2$ or $MgF_2$.

11. The optical device according to claim 1, wherein the metal layers are made of metal selected from the group consisting of gold, silver, aluminum, chromium, copper, iron, palladium, tin, indium, lead, titanium and alloys thereof.

* * * * *